(12) United States Patent
LiCausi et al.

(10) Patent No.: US 10,177,028 B1
(45) Date of Patent: Jan. 8, 2019

(54) METHOD FOR MANUFACTURING FULLY ALIGNED VIA STRUCTURES HAVING RELAXED GAPFILLS

(71) Applicant: GLOBALFOUNDRIES INC., Grand Cayman (KY)

(72) Inventors: Nicholas V. LiCausi, Watervliet, NY (US); Errol Todd Ryan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/643,742

(22) Filed: Jul. 7, 2017

(51) Int. Cl.
| | |
|---|---|
| *H01L 21/768* | (2006.01) |
| *H01L 23/522* | (2006.01) |
| *H01L 23/528* | (2006.01) |
| *H01L 23/532* | (2006.01) |

(52) U.S. Cl.
CPC .. *H01L 21/76805* (2013.01); *H01L 21/76834* (2013.01); *H01L 21/76837* (2013.01); *H01L 21/76843* (2013.01); *H01L 21/76877* (2013.01); *H01L 23/528* (2013.01); *H01L 23/5226* (2013.01); *H01L 23/53238* (2013.01)

(58) Field of Classification Search
CPC ............. H01L 21/768; H01L 21/76805; H01L 21/76834; H01L 21/76837
See application file for complete search history.

(56) References Cited

U.S. PATENT DOCUMENTS

| | | | |
|---|---|---|---|
| 8,664,113 B2 | 3/2014 | Kim | |
| 9,177,858 B1 * | 11/2015 | Zhang | H01L 21/7685 |
| 9,324,650 B2 | 4/2016 | Edelstein et al. | |
| 9,349,691 B2 * | 5/2016 | Murray | H01L 23/53295 |
| 9,859,433 B1 * | 1/2018 | Edelstein | H01L 23/53238 |
| 9,875,966 B1 * | 1/2018 | Yang | H01L 21/76883 |
| 2006/0273431 A1 * | 12/2006 | He | H01L 21/76834 257/632 |
| 2007/0077761 A1 * | 4/2007 | Lehr | H01L 21/76802 438/687 |
| 2009/0206489 A1 * | 8/2009 | Li | H01L 21/0337 257/774 |
| 2015/0270215 A1 | 9/2015 | Peng et al. | |
| 2017/0178955 A1 * | 6/2017 | Jiang | H01L 21/76877 |
| 2017/0301624 A1 * | 10/2017 | Briggs | H01L 23/5283 |
| 2018/0025969 A1 * | 1/2018 | Adusumilli | H01L 23/528 |

\* cited by examiner

*Primary Examiner* — Phuc T Dang
(74) *Attorney, Agent, or Firm* — Anthony Canale; Andrew M. Calderon; Roberts Mlotkowski Safran Cole & Calderon, P.C.

(57) ABSTRACT

The present disclosure generally relates to semiconductor structures and, more particularly, to fully aligned via structures having relaxed gapfills and methods of manufacture. The method includes: selectively depositing a capping material on a conductive material within a plurality of interconnect structures to form capped interconnect structures; depositing at least one insulator material over the capped interconnect structures; forming a fully aligned via structure through the at least one insulator material to expose the capping material; filling the fully aligned via structure with an alternative metal; and depositing a metal material on the alternative metal in the fully aligned via structure.

20 Claims, 4 Drawing Sheets

METHOD FOR MANUFACTURING FULLY ALIGNED VIA STRUCTURES HAVING RELAXED GAPFILLS

FIELD OF THE INVENTION

The present disclosure generally relates to semiconductor structures and, more particularly, to fully aligned via structures having relaxed gapfills and methods of manufacture.

BACKGROUND

A via is an electrical connection between wiring structures (e.g., wiring layers) in a physical electronic circuit that goes through the plane of one or more adjacent layers. For example, in integrated circuit design, a via is a small opening in an insulating oxide layer that allows a conductive connection between different wiring layers. A via connecting the lowest layer of metal to diffusion or poly is typically called a "contact".

Fully aligned vias can have challenging integration issues. For example, gapfill of traditional ultra low-k (ULK) materials in the topography is challenging. A reason is that due to the relatively high aspect ratio of topography at advanced technology nodes of 7 nm and beyond, standard ULK materials form voids when deposited and/or cured, which prevents the filling of the topography.

One way to alleviate this gapfill problem is to reduce the recess depth of the fully aligned via structure. However, this cannot be done without minimum insulator concerns. The minimum insulator is a minimum space between two neighboring lines, and pertains primarily to copper (Cu) to Cu separation in the line and via structures. Specifically, the minimum insulator must be above a certain tolerance in order to ensure the electric field between the different conductors does not exceed a certain value. More particularly, the closer the conductors (via structures) come with respect to one another, the greater the likelihood of an instantaneous breakdown of the dielectric occurring.

Another concern with the minimum insulator is the occurrence of time dependent dielectric breakdown (TDDB). In TDDB, the dielectric becomes stressed by the electric field over a period of time, resulting in an eventual break down of the dielectric. In a particular example, Cu ions from the via structure diffuse into the dielectric and eventually form a filament, which creates the dielectric breakdown.

In order to meet minimum insulator requirements, recess depth of the skip via must be maintained at approximately 7 nm or greater. Therefore, reducing the recess depth of the via structure is not feasible. Another approach to address the gapfill issue is to change the material used for the dielectric gap. However, other materials, such as ultra low-k (ULK) materials having a dielectric constant equal to or less than 2.7, may result in voids, or may not have satisfactory electrical properties, amongst other examples.

SUMMARY

In an aspect of the disclosure, a method comprises: selectively depositing a capping material on a conductive material within a plurality of interconnect structures; depositing at least one insulator material over the capped interconnect structures; forming a fully aligned via structure through the at least one insulator material to expose the capping material; filling the fully aligned via structure with an alternative metal; and depositing a metal material on the alternative metal in the fully aligned via structure.

In an aspect of the disclosure, a method comprises: forming a plurality of interconnect structures; recessing the interconnect structures; selectively depositing conductive capping material in the recesses in direct contact with metal material of the interconnect structures; forming a conformal dielectric layer over the conductive capping material; forming a gapfill layer over the conformal dielectric layer; forming a fully aligned via structure in an upper interconnect layer through the gapfill layer and the dielectric layer, exposing the conductive capping material; filling the fully aligned via structure with an alternative metal in direct electrical contact with the conductive capping material; and depositing a metal fill material in the upper interconnect layer in direct electrical contact with the alternative metal in the fully aligned via structure.

In an aspect of the disclosure, a structure comprises: a plurality of lower wiring structures comprising a conductive material and a conductive capping material of a different material than the conductive material; a via structure extending through an upper wiring level and landing on at least one of the plurality of lower wiring structures, the via structure comprising an alternative metal fill material in electrical contact with the conductive capping material; and at least one upper wiring structure in electrical contact with the via structure, the at least one upper wiring structure having a same material as the conductive material of the lower wiring structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to fully aligned via structures having relaxed gapfills and methods of manufacture. In embodiments, the processes and structures provided herein implement via structures having selective metals such as ruthenium (Ru) and/or cobalt (Co). Advantageously, the selective metals relieve insulator gapfill requirements for back-end-of-line (BEOL) ultra low-k (ULK) materials.

In embodiments, the minimum insulator requirements of the via structures can be relaxed because the critical dimension for the minimum insulator is bordered by the selective metal material, i.e., Ru or Co. In addition, use of the selective metals relaxes metallization challenges by prefilling and/or filling the via (interconnect) structure with similar metals, enabling higher aspect ratio metal lines if desired, i.e., lower resistance. Additionally, the use of selective metals will not intrinsically lead to an increase in via resistance.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
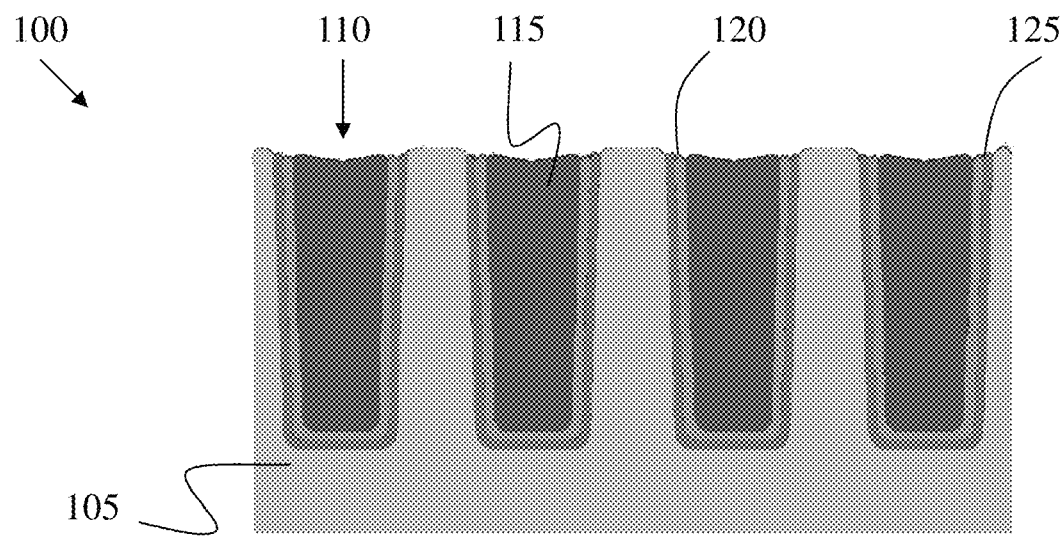
FIG. 1 shows an incoming structure and respective fabrication processes in accordance with aspects of the present disclosure.

FIG. 1 shows an incoming structure and respective fabrication processes in accordance with aspects of the present disclosure. Specifically, FIG. 1 illustrates an initial structure following BEOL metallization and CMP processes. More specifically, the structure 100 includes a dielectric layer 105 having a plurality of interconnect structures 110, i.e., lines, formed in dielectric layer 105. The dielectric layer 105 can be any interlevel dielectric (ILD) material including, e.g., a ULK material and can be formed with multiple dielectric materials. In embodiments, the dielectric layer 105 can be a dense oxide material, ULK or SiN, amongst other materials.

The interconnect structures 110 can be formed by conventional lithography and etching (reactive ion etching (RIE)) techniques followed by deposition of liner 125 and barrier 120 materials, followed by a conductive material 115 comprising a metal or metal alloy or other via prefill material, e.g., Cu or Co. The barrier 120 can be TaN and the liner 125 can be TiN, or materials such as Ru and Co, amongst other examples. In embodiments, the materials can be deposited using conventional deposition processes, e.g., physical vapor deposition (PVD) or chemical vapor deposition (CVD) process. Any residual material on a surface of the dielectric layer can be removed by a chemical mechanical polishing (CMP) processes.

Figure 2:
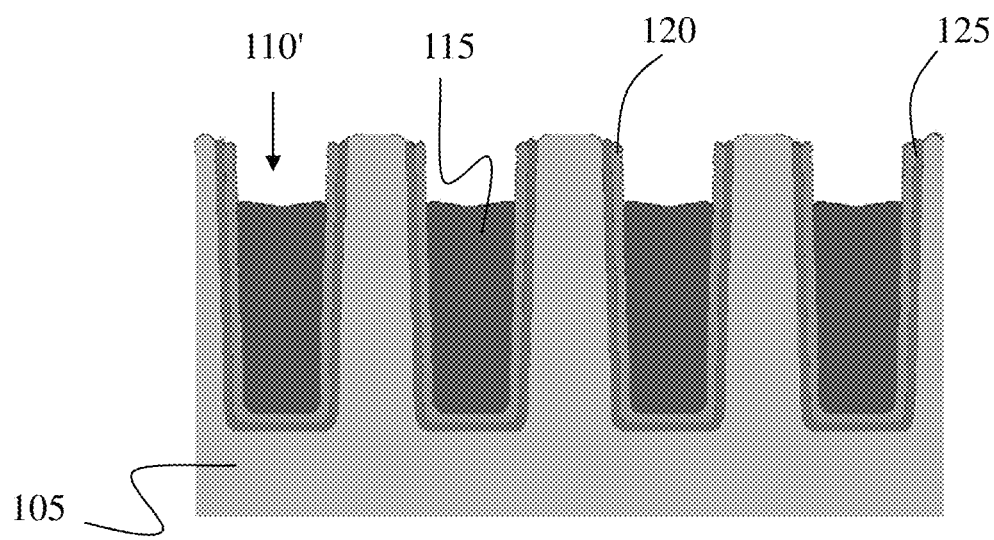
FIG. 2 shows the structure of FIG. 1 with recessed conductor metals, amongst other features, and respective fabrication processes in accordance with aspects of the present disclosure.

FIG. 2 illustrates a selective etching process to the Cu, i.e., the conductive material 115. As shown in FIG. 2, the conductive material 115 is recessed without a mask by a wet chemical etching process, as an example, to form the interconnect structures 110'. For example, the wet etch process can use chemistries to remove Cu. The recess formed by this process can have a depth in a range of about 7 nm to 15 nm, and more particularly, in a range of 5 nm to 12 nm; although other dimensions which address gapfill and the minimum insulator concerns are also contemplated herein.

Figure 3:
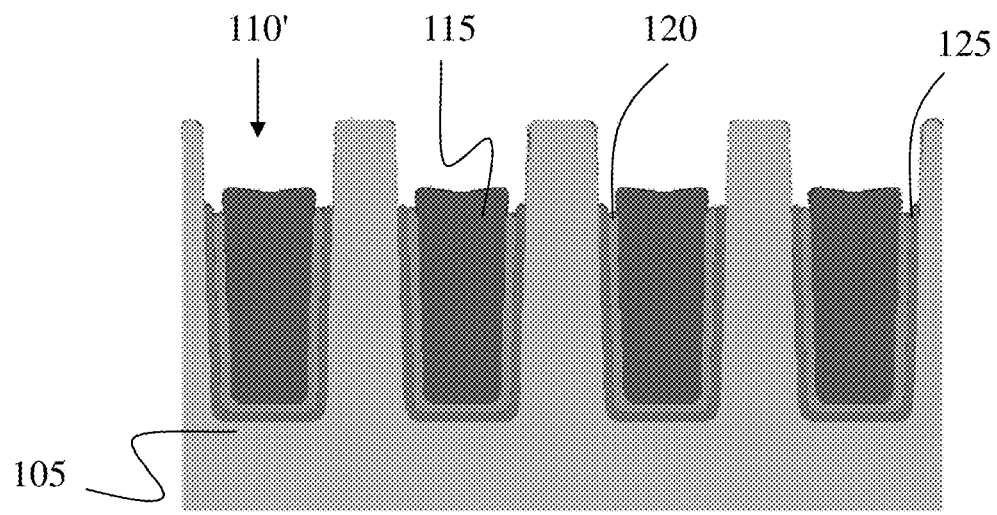
FIG. 3 shows the structure of FIG. 2 with recessed liner and barrier layers, amongst other features, and respective fabrication processes in accordance with aspects of the present disclosure.

In FIG. 3, the liner 125 and barrier 120 can be recessed by a selective etching process. Specifically, the liner 125 and the barrier 120 can be recessed by a wet etch process which uses chemistries to remove the barrier 120 and liner 125, e.g., TiN, TaN, Ru and Co, etc. In this process, the conductive material 115 will not be removed.

Figure 4:
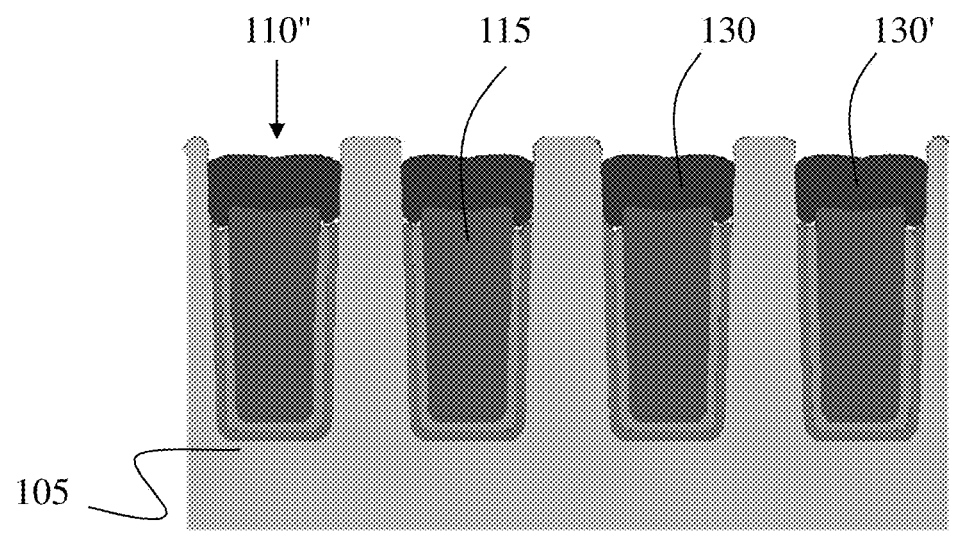
FIG. 4 shows capped interconnect structures, amongst other features, and respective fabrication processes in accordance with aspects of the present disclosure.

In FIG. 4, deposition of a metal (e.g., selective metal) is provided in the via interconnect structure 110' to form capped interconnect structures 110". In embodiments, the metals 130, 130' is a selective metal that will alleviate gapfill concerns; that is, the deposition of the metals 130, 130' will relax minimum insulator requirements in the top region near the via structure, where the minimum insulator concerns are the strongest. In this way, the use of the metals 130, 130' will prevent voids in the insulator material, deposited over the capped interconnect structures 110".

The metals 130, 130' can be selectively deposited, e.g., grown, directly on the conductive material 115 to form a cap on the conductive material 115 (and not on the dielectric layer 105). The selective growth of the metals 130, 130' (capping material) directly on the conductive material 115 within the plurality of interconnect structures 110' requires no polishing process, e.g., CMP. The deposition of the metals 130, 130' can be in a range of about 3 nm to 10 nm, for example, and more particularly in a range of about 5 nm to 12 nm to form capped interconnect structures 110". The deposition of the metals 130, 130' can relax or eliminate topography to a regime where traditional ULK can be used for integration.

The metals 130, 130' can be Ru, Co, Mo, Ni and W, for example, and should differ from the conductive material 115. Therefore, the capped interconnect structures 110" can have a first conductive metal, e.g., Cu, and a second conductive metal, e.g., Ru, Co, Mo, Ni or W. The use of the metals 130, 130' along with the conductive material 115 such as Cu maintains a lower resistance than solely using an alternative to Cu, like Ru or Co, while resolving upper level dielectric gapfill and minimum insulator concerns.

Figure 5:
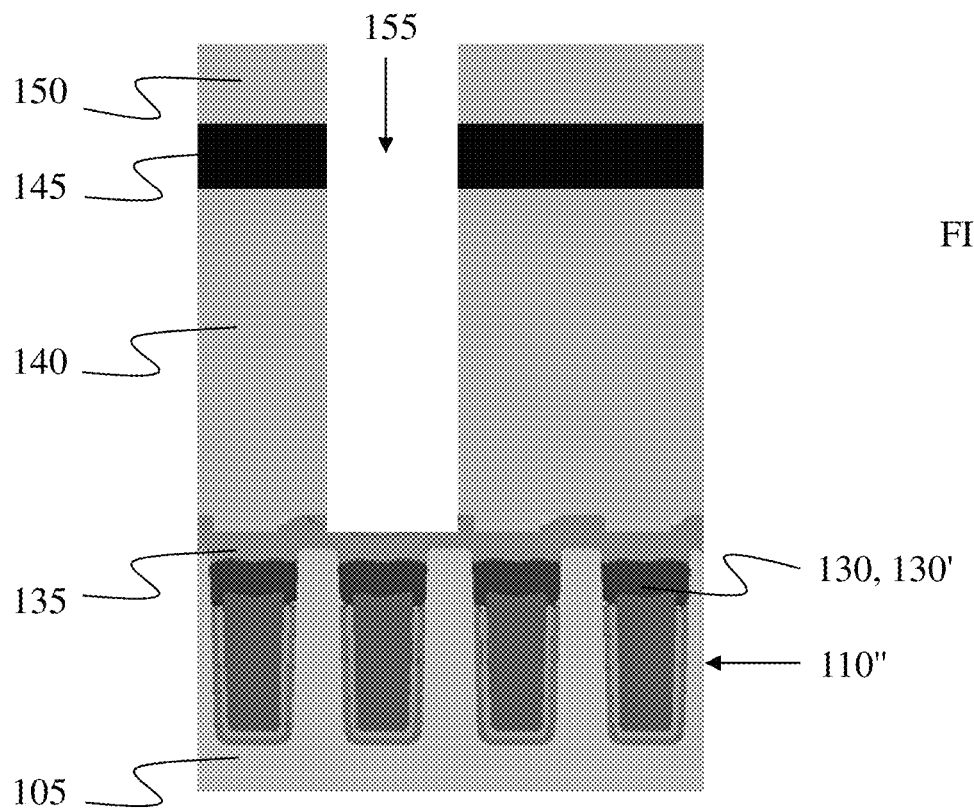
FIG. 5 shows a fully aligned via structure patterned through an upper dielectric material extending to a capping layer, amongst other features, and respective fabrication processes in accordance with aspects of the present disclosure.

FIG. 5 shows a conformal dielectric capping layer 135 deposited over the capped (via) interconnect structures 110", amongst other features. The dielectric capping layer 135 can be made of SiN, SiCN, SiNO or SiC, for example. Additionally, the dielectric capping layer 135 can have a thickness in a range of about 3 nm to 10 nm. The dielectric capping layer 135 can be considered a liner material over the metals 130, 130'.

A dielectric layer 140 is deposited over the dielectric capping layer 135. The dielectric layer 140 can be an ILD or ULK material, for example. Further, the dielectric capping layer 135 and the dielectric layer 140 can act as an insulator material. A sacrificial dielectric 145 is formed over the dielectric layer 140, and is covered by a hardmask 150. The hardmask 150 can be a TiN material deposited by any conventional deposition processes, e.g., physical vapor deposition (PVD) processes. A via structure 155 is formed through the dielectric layer 140, the sacrificial dielectric 145 and the hardmask 150, initially exposing the dielectric capping layer 135 (which acts as an etch stop layer). The fully aligned via (FAV) via structure 155 can be formed by a lithography and etching process. For example, a resist formed over the hardmask 150 is exposed to light to form an opening. The opening is then etched by a conventional etching process (e.g., RIE) to form the via structure 155. The via structure 155 lands on the dielectric capping layer 135, i.e., the SiN material.

Figure 6:
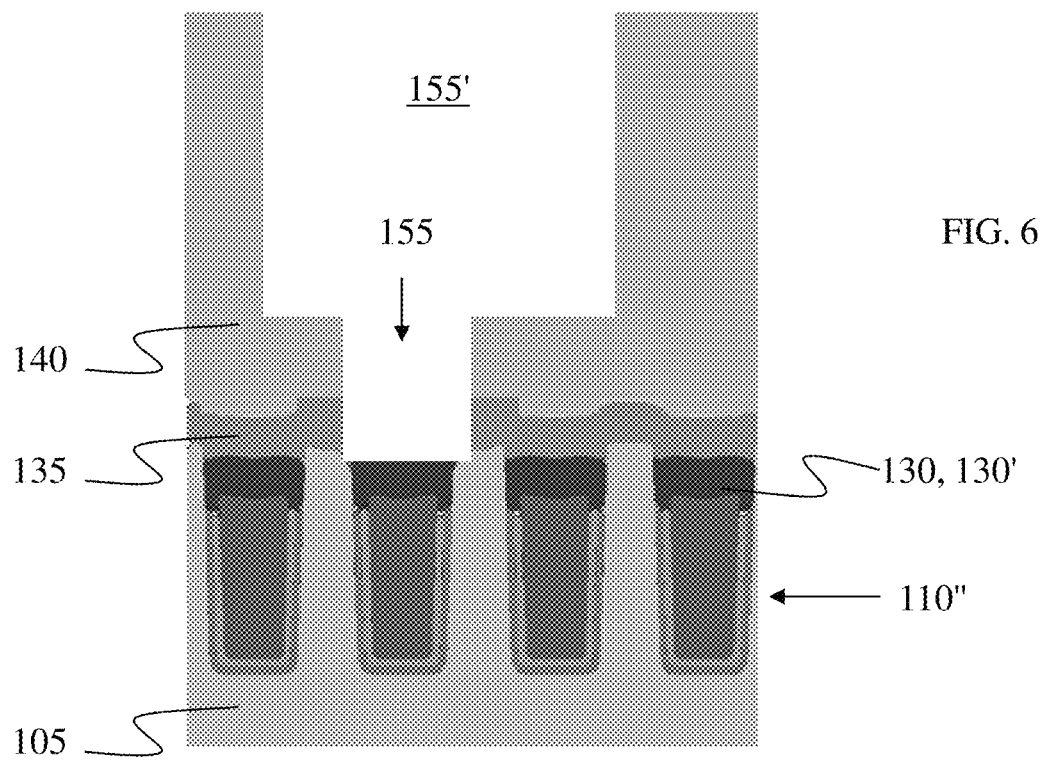
FIG. 6 shows the fully aligned via structure extending to a metal capping layer, amongst other features, and respective fabrication processes in accordance with aspects of the present disclosure.

FIG. 6 illustrates the via structure 155 extending (etched) to the lower wiring (metallization) layer containing the capped interconnect structures 110". In embodiments, the FAV via structure 155 is extended by an etching process through the dielectric capping layer 135, exposing the metal 130 or metal 130' of the capped interconnect structure 110". During the etching process, chemistries will also form a trench 155' at least partially within the dielectric layer 140 while also etching through the dielectric capping layer 135. This, in turn, will result in a dual damascene structure. The resist and any lithography materials can be removed by any conventional stripants, e.g., oxygen ashing techniques. Additionally, the sacrificial dielectric 145 and the hardmask 150 are removed, by conventional wet etching processes.

Figure 7:
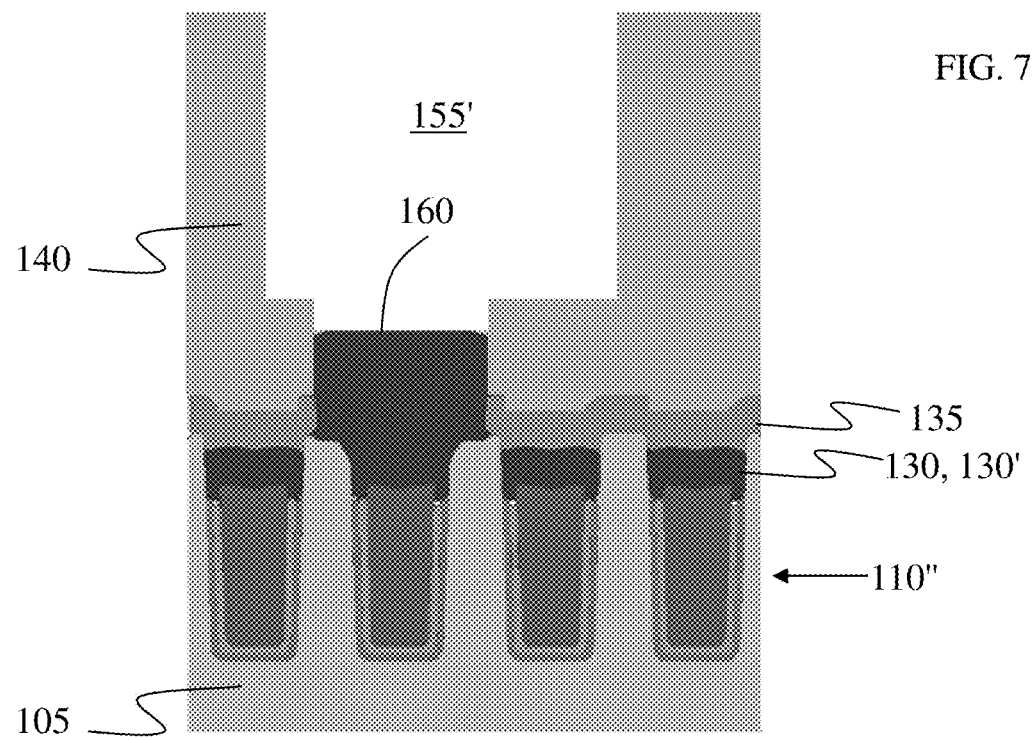
FIG. 7 shows the fully aligned via structure filled with a metal, amongst other features, and respective fabrication processes in accordance with aspects of the present disclosure.

In FIG. 7, a metal fill material (prefill) is deposited directly over the exposed metals 130, 130' in the FAV via structure 155 by conventional deposition processes, e.g., electroless deposition, or selective CVD, to form the fully aligned via in the upper metallization layer. The metal 160 can be Ru, Co, Mo, Ni and W. Further, the metal 160 can be the same as metals 130, 130'. As an example, both can be Ru. Additionally, the metal 160 and the metal 130 can be alternative metals, e.g., one can be Co and the other Ru. That is, the metal 160 in the FAV via structure 155 can be an alternative metal. In embodiments, the metal 160, i.e., the via prefill conductive material, is grown on the exposed surface of the metals 130, 130'. The selective growth of the metal 160 on the metals 130, 130' requires no polishing process. In embodiments, the metal 160 is Ru or Co.

Figure 8:
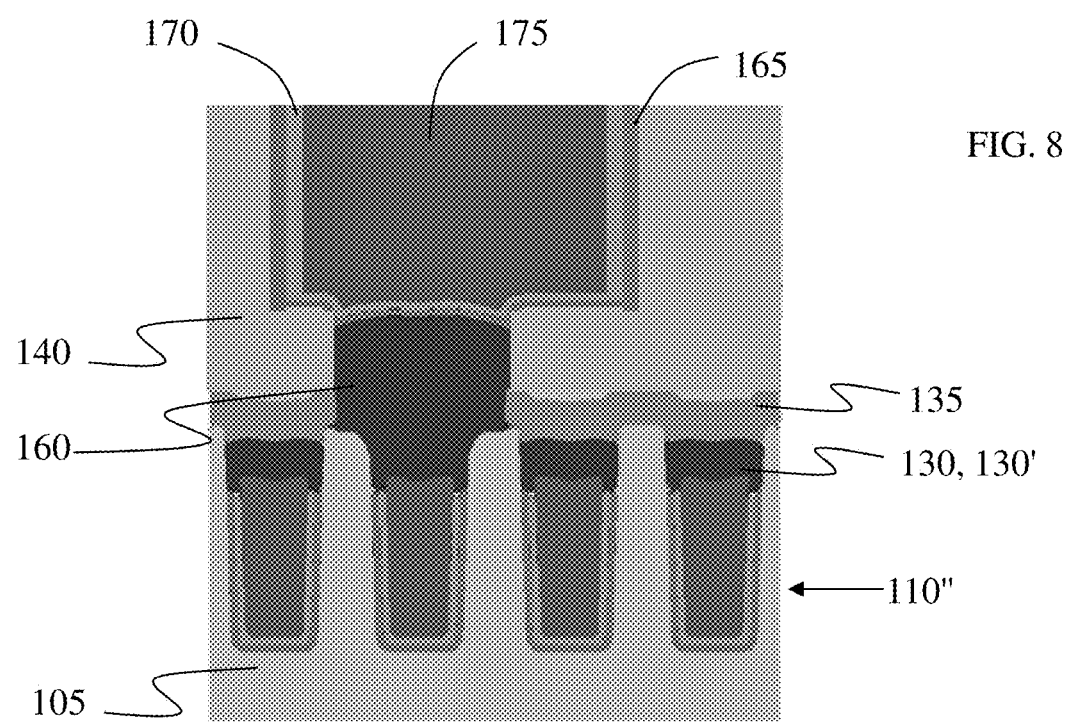
FIG. 8 shows a filled fully aligned via structure and upper interconnect layer, amongst other features, and respective fabrication processes in accordance with aspects of the present disclosure.

In FIG. 8, after the growth of the metal 160, a liner 165 and barrier 170 are deposited over the metal 160, on sidewalls of the trench 155' and on a surface of the dielectric layer (material) 140, i.e., on the metal 160 and the dielectric layer 140 by conventional deposition processes, e.g., PVD or CVD. A metal (fill material) 175 is deposited on the barrier 170 in an upper interconnect layer by a CVD and/or plating process, followed by a CMP process to planarize the metal 175. In embodiments, the metal 175 can be composed of any suitable conductive material such as Cu, amongst other examples. The metal 175 is in direct electrical contact with the metal 160 in the FAV via structure 155. As shown in FIG. 8, the dielectric layer 140 now acts as a gapfill layer over the conformal dielectric capping layer 135. The FAV via structure 155 is formed through the dielectric layer (gapfill layer) 140 and the dielectric capping layer 135. Further, the capped (via) interconnect structures 110" are shown as a plurality of lower wiring structures, while the dielectric layer 140 serves as a upper wiring level and the metal 175 acts as an upper wiring structure in electrical contact with the FAV via structure 155.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    selectively depositing a capping material on a conductive material within a plurality of interconnect structures to form capped interconnect structures;
    depositing at least one insulator material over the capped interconnect structures;
    forming a fully aligned via structure through the at least one insulator material to expose the capping material;
    filling the fully aligned via structure with an alternative metal; and
    depositing a metal material on the alternative metal in the fully aligned via structure, wherein the at least one insulator material is a liner material over the metal material and an interlevel dielectric layer.

2. The method of claim 1, wherein the conductive material is a Cu.

3. The method of claim 1, wherein the capping material is Ru.

4. The method of claim 1, wherein the capping material is Co.

5. The method of claim 1, wherein the alternative metal is Ru.

6. The method of claim 5, wherein the alternative metal is Co.

7. The method of claim 1, wherein the capping material and the metal material are the same material.

8. The method of claim 7, wherein the liner material is made of SiN, SiCN, SiNO or SiC.

9. The method of claim 8, wherein the liner material has a thickness in a range of 3 nm to 10 nm.

10. The method of claim 9, further comprising depositing a sacrificial layer over the at least one insulator material prior to forming the fully aligned via structure.

11. The method of claim 10, wherein further comprising covering the sacrificial layer with a hardmask prior to forming the fully aligned via structure.

12. The method of claim 11, wherein the hardmask is a TiN material.

13. The method of claim 12, wherein the fully aligned via structure is formed through the interlevel dielectric layer, the sacrificial layer, the TiN material and the liner material.

14. A method, comprising:
    forming a plurality of interconnect structures;
    recessing the interconnect structures;
    selectively depositing conductive capping material in the recesses in direct contact with metal material of the interconnect structures;
    forming a conformal dielectric layer over the conductive capping material;
    forming a gapfill layer over the conformal dielectric layer;
    forming a fully aligned via structure through the gapfill layer and the dielectric layer, exposing the conductive capping material;
    filling the fully aligned via structure with an alternative metal in direct electrical contact with the conductive capping material; and depositing a metal fill material in an upper interconnect layer in direct electrical contact with the alternative metal in the fully aligned via structure.

15. The method of claim 14, wherein the conductive capping material and the alternative metal are composed of Ru.

16. The method of claim 14, wherein the conductive capping material and the alternative metal are composed of Co.

17. The method of claim 14, wherein the conductive capping material is a different metal from the alternative metal in the fully aligned via structure.

18. The method of claim 14, wherein the gapfill layer is an ultra low-k dielectric.

19. The method of claim 14, wherein the recesses have a depth in the range of 5 to 12 nm.

20. The method of claim 14, wherein the metal material of the interconnect structures is Cu.

\* \* \* \* \*